(12) United States Patent
Sforzin

(10) Patent No.: US 8,659,970 B2
(45) Date of Patent: Feb. 25, 2014

(54) MEMORY DEVICE POWER CONTROL

(75) Inventor: Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 13/422,652

(22) Filed: Mar. 16, 2012

(65) Prior Publication Data

US 2013/0242682 A1 Sep. 19, 2013

(51) Int. Cl.
*G11C 5/14* (2006.01)

(52) U.S. Cl.
USPC ........... 365/226; 365/185.05; 365/63; 365/95

(58) Field of Classification Search
USPC ................................. 365/226, 185.05, 63, 95
See application file for complete search history.

(56) References Cited

U.S. PATENT DOCUMENTS

| 5,148,390 | A * | 9/1992 | Hsieh ............................ 365/95 |
| 6,570,401 | B2 | 5/2003 | Correale et al. |
| 6,768,354 | B2 | 7/2004 | Yamazaki |
| 7,830,039 | B2 | 11/2010 | Nguyen et al. |
| 2008/0061849 | A1 | 3/2008 | Ahn |
| 2010/0164559 | A1 | 7/2010 | Park |

FOREIGN PATENT DOCUMENTS

KR   20110047802 A   5/2011

* cited by examiner

*Primary Examiner* — Jason Lappas
(74) *Attorney, Agent, or Firm* — Schwegman, Lundberg & Woessner, P.A.

(57) ABSTRACT

The apparatus described herein may comprise a first set of transistors, including a first transistor and a second transistor, and a second set of transistors, including a third transistor and a fourth transistor. Gates of the first and second transistors may be coupled to a first signal and a second signal, respectively, each indicating whether a corresponding one of a first supply voltage and a second supply voltage reaches a first threshold voltage or a second threshold voltage to power on a first circuit or a second circuit of a memory device. Gates of the third and fourth transistors may be coupled to a first inverted version of the first signal and a second inverted version of the second signal, respectively. An outcome signal of the second set of transistors may indicate a power-on state of the memory device responsive to power states of the first and second signals.

15 Claims, 9 Drawing Sheets

MEMORY DEVICE POWER CONTROL

BACKGROUND INFORMATION

Electronic products are expected to begin operating shortly after they are powered on. To meet this expectation, each device (e.g., a semiconductor memory device) used in such products is also designed to become operational shortly after a relevant supply voltage is applied. To become ready for use, the device executes a planned power-on initialization sequence. This initialization sequence and/or activities may be unique to each device and range from simple to complex, for example, when the device includes more than two circuits and needs more than one supply voltage to initialize a power-on phase of the device.

DETAILED DESCRIPTION

Figure 1:
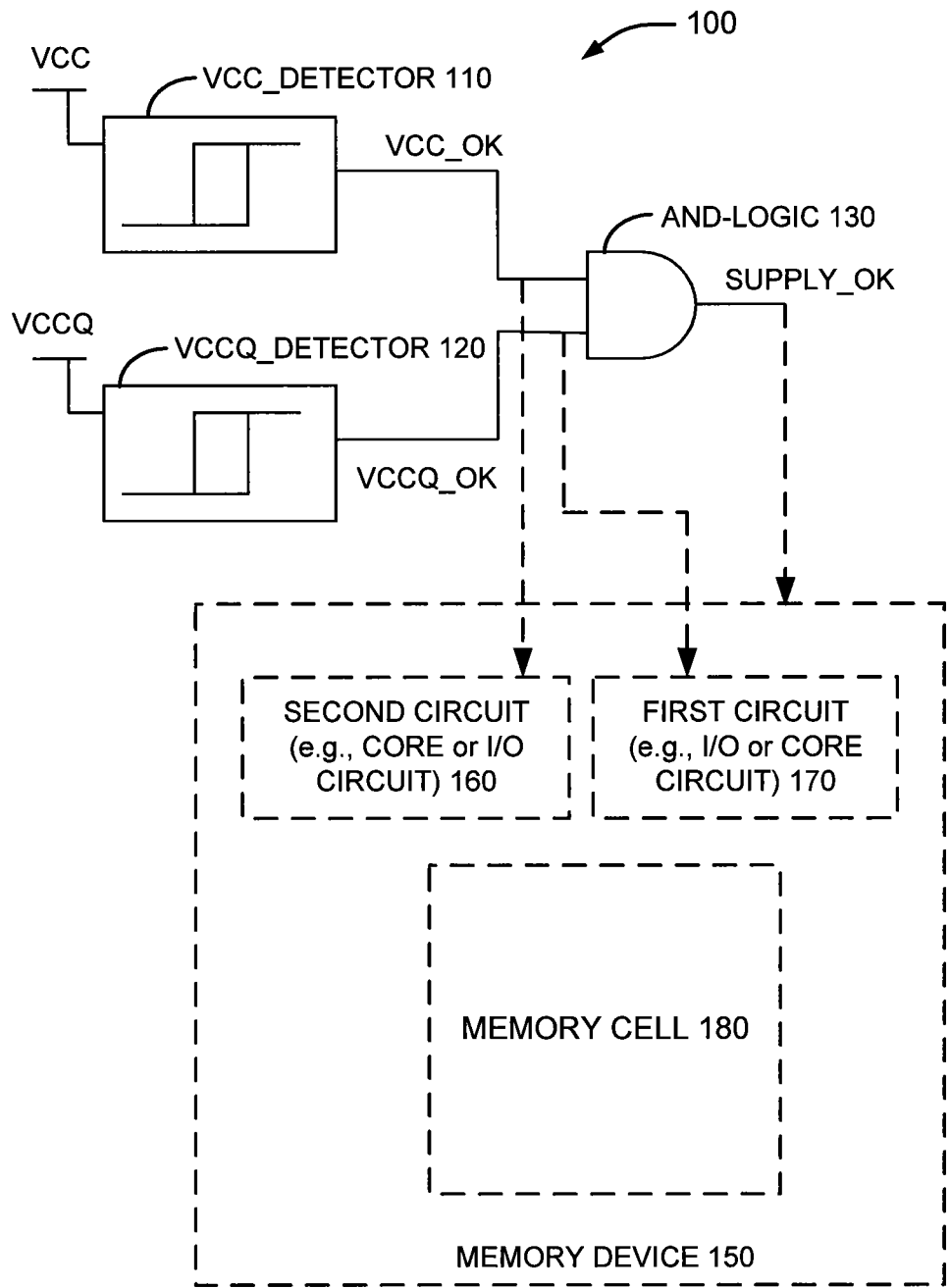
FIG. 1 shows a block diagram of a power-on initialization device to power on a memory device using multiple supply voltages, according to various embodiments.

The following description and the drawings sufficiently illustrate specific embodiments to enable those of ordinary skill in the art to practice them. Other embodiments may incorporate structural, logical, electrical, process, and other changes. Portions and features of some embodiments may be included in, or substituted for, those of other embodiments. The embodiments set forth in the claims encompass all available equivalents of those claims.

A device, such as a semiconductor memory device, including a plurality of circuits (e.g., a core circuit and an input/output (I/O) circuit) may be designed to become operational with more than one supply voltage. For example, the core circuit may become operational with a core supply voltage (e.g., VCC), and the I/O circuit may become operational with an I/O supply voltage (e.g., VCCQ). The voltages VCC and VCCQ can have different values. For example, the value of the voltage VCC may be about 1.8V, and the value of the voltage VCCQ may be about 1.2V. The device may be provided with a signal that indicates the presence of the supply voltage for a corresponding one of the plurality of circuits.

A circuit, such as a supply voltage detector, may be provided to check the value of the supply voltage (e.g., VCC). The supply voltage detector may be configured to respond with an outcome signal (e.g., VCC_OK) being zero (0) or low level (e.g., VCC_UP) if the supply voltage detected exceeds a threshold voltage (e.g., VCC_MIN). Otherwise, the circuit may respond with the outcome signal (e.g., VCC_OK) being one (1) or high level (e.g., VCC_DOWN). For example, the low level state of the outcome signal (e.g., VCC_UP) and its negated version, i.e., a high level state of the outcome signal (e.g., VCC_DOWN) may be in the voltage swing (or range) of about [0V, 1.8V].

A similar detection mechanism may be employed for the voltage VCCQ, so that the low level state (e.g., VCCQ_UP) and the high level state (e.g., VCCQ_DOWN) of its outcome signal (e.g., VCCQ_OK) may be produced in the voltage swing (or range) of about [0V, 1.2V]. However, it may be useful to detect the presence of one supply voltage (e.g., VCCQ) for one circuit (e.g., I/O circuit) in response to a different voltage range (e.g., about [0V, 1.8V]) associated with another supply voltage (e.g., VCC) for another circuit (e.g., core circuit), and vice versa. Existing voltage detection techniques do not provide this functionality.

In addition, under conventional power-on initialization techniques, the VCCQ I/O supply voltage signal does not participate directly in the power-on sequence. Instead, only the voltage VCC is monitored because the internal algorithm of the power-on process is executed by circuits that are powered on at the level of the voltage VCC. This means that the relevant circuit (e.g., I/O circuit) is usually reset via user interface commands to avoid functional problems in the circuit, or in the device including the circuit, such as when the voltage VCCQ exceeds a safety limit during the power-on phase of the device.

The PAD interface provides a registered I/O interface for data and control signals. In some cases, undesired power consumption may result from using the core supply voltage (e.g., VCC) to power on the device, such as when a CKE (Clock Enable) PAD connection of the PAD interface is at a low level. For example, the CKE may be a PAD signal supplied at the level (e.g., about 1.2V) of the I/O supply voltage (e.g., VCCQ), and its voltage value may be well defined only if the I/O supply voltage (e.g., VCCQ) has reached a target value (e.g., VCCQ_MIN). This type of approach may result in undesired power consumption during the power-on phase of the device since, for example, the power-on activities run independently of the actions of the voltage VCCQ (and the CKE PAD connection). Current consumption may exceed certain limits, such as about 15 mA.

Furthermore, under some conventional power-on initialization techniques, the power-on phase of the device may begin when the core supply voltage (e.g., VCC) has reached its specified threshold voltage (e.g., VCC_MIN) because the VCC is the supply voltage for various circuits of the device, such as a band-gap voltage reference (BGAP) circuit, read charge pumps, the microcontroller clock and the microcontroller itself (e.g., the core circuit). When this occurs, it becomes impossible to drive the power-on phase using pad activity.

For example, the device (e.g., a memory device) may include supply pads and control pads. The voltages VCC and VCCQ are examples of the voltages that may be present at supply pads, and the CKE signal is an example of a signal that may be present at a control pad. Using control pads, specific activities to be accomplished by the device can be controlled. The control pads can act internally in the device by means of circuits supplied at the level of the voltage VCCQ. Therefore, if the VCCQ is at a low level (e.g., does not meet the level of VCC), the user cannot use the control pads to control the device. Only automatic processes can be executed. That is, it is impossible for the user to implement controlling actions during the power-on phase of the device, such as actions to reduce power consumption when desired, or to increase/decrease clock frequency, etc.

In contrast, in various embodiments of the invention, the various currents may be kept below applicable limits (e.g., about 15 mA) until the rising edge of the CKE signal occurs. For example, during the power-on phase of the device, when the voltage VCCQ is detected, the power-on process of the device may be suspended until the VCCQ_OK signal indicating that the voltage VCCQ has reached a threshold value (e.g., VCCQ_MIN) arrives, so as to reduce the power consumption with the CKE at a low level. In this way, the power-on phase of the device, including a plurality of circuits, may begin only after all the supply lines have a sufficient level of voltage.

For example, in the case of a memory device having two supply voltages (e.g., VCC and VCCQ), various embodiments of the invention may operate so that both the VCC and VCCQ have reached their corresponding minimum value (e.g., VCC_MIN or VCCQ_MIN) substantially simultaneously in order to power on the device successfully. Designing the power-on sequence of the device to occur only after all the supply voltages have reached a threshold value allows human intervention during the power-on process to better control the device. Also, various embodiments of the invention allows detecting the presence of one supply voltage (e.g., VCCQ) for one circuit (e.g., I/O circuit) in response to the value of a voltage in the range of another supply voltage (e.g., VCC) for another circuit (e.g., core circuit), and vice versa. Other benefits may result.

Various embodiments described herein may operate to indicate a power-on state of a memory device using multiple supply voltages. In various embodiments, for example, an apparatus may comprise a first set of transistors including a first transistor and a second transistor. A gate of the first transistor may be coupled to a first signal, and a gate of the second transistor may be coupled to a second signal. The first signal may indicate whether a first supply voltage for a first circuit of a memory device has reached a first threshold voltage to power on the first circuit, and the second signal may indicate whether a second supply voltage for a second circuit of the memory device has reached a second threshold voltage to power on the second circuit.

The apparatus may comprise a second set of transistors including a third transistor and a fourth transistor. A gate of the third transistor may be coupled to a first inverted version of the first signal, and a gate of the fourth transistor may be coupled to a second inverted version of the second signal. An outcome signal of the second set of transistors, such as an AND value of outcomes of the third and fourth transistors, may be generated responsive to power states of the first and second signals to indicate a power-on state of the memory device.

In various embodiments, the apparatus may further comprise a pull-up path including a fifth transistor and a sixth transistor. A gate of the fifth transistor may be coupled to at least one of the second set of transistors, and a gate of the sixth transistor may be coupled to at least one of the first set of transistors. In one embodiment, for example, the pull-up path may be configured to boost at least one of the first signal or the second signal based on a level of the second supply voltage. In one embodiment, for example, each of the fifth and sixth transistors may be coupled to the second supply voltage.

In various embodiments, the apparatus may comprise a pull-down leaker configured to resolve a floating state of the outcome signal. In one embodiment, for example, the pull-down leaker may be coupled to the third and fourth transistors in parallel. Various embodiments that incorporate these mechanisms are described below in more detail.

FIG. 1 shows a block diagram of a power-on initialization device 100 to power on a memory device 150 using multiple supply voltages, according to various embodiments. As shown in FIG. 1, in various embodiments, the power-on initialization device 100 may comprise a VCC_detector 110, a VCCQ_detector 120, and AND_logic 130. The VCC_detector 110 may comprise a core supply voltage detector, and the VCCQ_detector 120 may comprise an I/O supply voltage detector. The VCC_detector 110 may comprise a circuit that is capable of detecting whether a core supply voltage, such as voltage VCC, has reached a first minimum value, such as VCC_MIN, to power on a first circuit 170 of the memory device 150. In one embodiment, the VCC_detector 110 may be configured to generate an output signal, such as output signal VCC_OK, responsive to the voltage VCC detected reaching the minimum value VCC_MIN.

Similarly, the VCCQ_detector 120 may comprise a circuit that is capable of detecting whether an I/O supply voltage, such as voltage VCCQ, has reached a second minimum value, such as VCCQ_MIN, to power on a second circuit 160 of the memory device 150. In one embodiment, the VCCQ_detector 120 may be configured to generate an output signal, such as output signal VCCQ_OK, responsive to the voltage VCCQ detected reaching the minimum value VCCQ_MIN. In one embodiment, for example, the signal VCC_OK may be in the range of about [0, 1.8V], and the signal VCCQ_OK may be in the range of about [0, 1.2V]. In one embodiment, the outcome signal SUPPLY_OK may be coupled to the memory device 150 including a memory cell 180.

In various embodiments, at least one of the VCC_detector 110 or the VCCQ_detector 120 may be provided with a hysteresis property. For example, there may be two switching thresholds for the voltage VCC, one for a rising edge and the other for a falling edge. If the voltage VCC is rising, then the threshold for the rising voltage VCC may be about 1.5V. However, if the voltage VCC switches and starts falling, then the threshold for the falling voltage VCC may be about 1.4V. In this way, undesired oscillation may be avoided at the output of the VCC_detector, in signal VCCQ_OK. The same hysteresis property may be applied to the VCCQ_detector 120 alternatively or in addition to the property exhibited by the VCC_detector 110. Detailed descriptions of the structure and/or function of the VCC_detector 110 and the VCCQ_detector 120 according to various embodiments are provided below with respect to FIGS. 2 and 5-7.

In various embodiments, the AND_logic 130 may receive the outcome signals, such as the signal VCC_OK and the signal VCCQ_OK, from the VCC_detector 110 and the VCCQ_detector 120, respectively. The AND_logic 130 may then generate its own outcome signal, such as the signal SUPPLY_OK, based on the values of the signal VCC_OK and the signal VCCQ_OK. In one embodiment, the signal SUPPLY_OK may indicate whether the memory device, including the first and second circuits, is powered-on such that the activities for a power-on phase of the device have been successfully performed.

Figure 2:
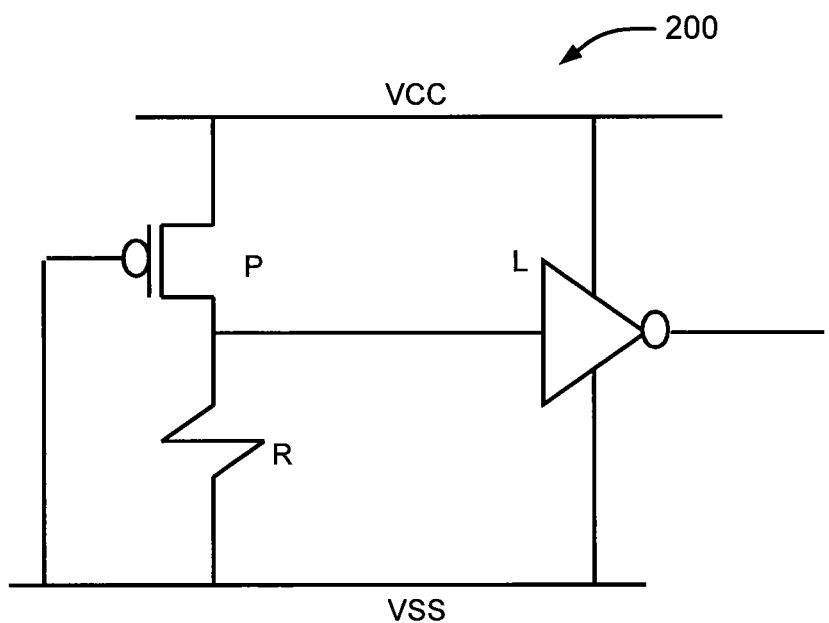
FIG. 2 shows a schematic diagram of a voltage detector according to various embodiments.
Figure 4:
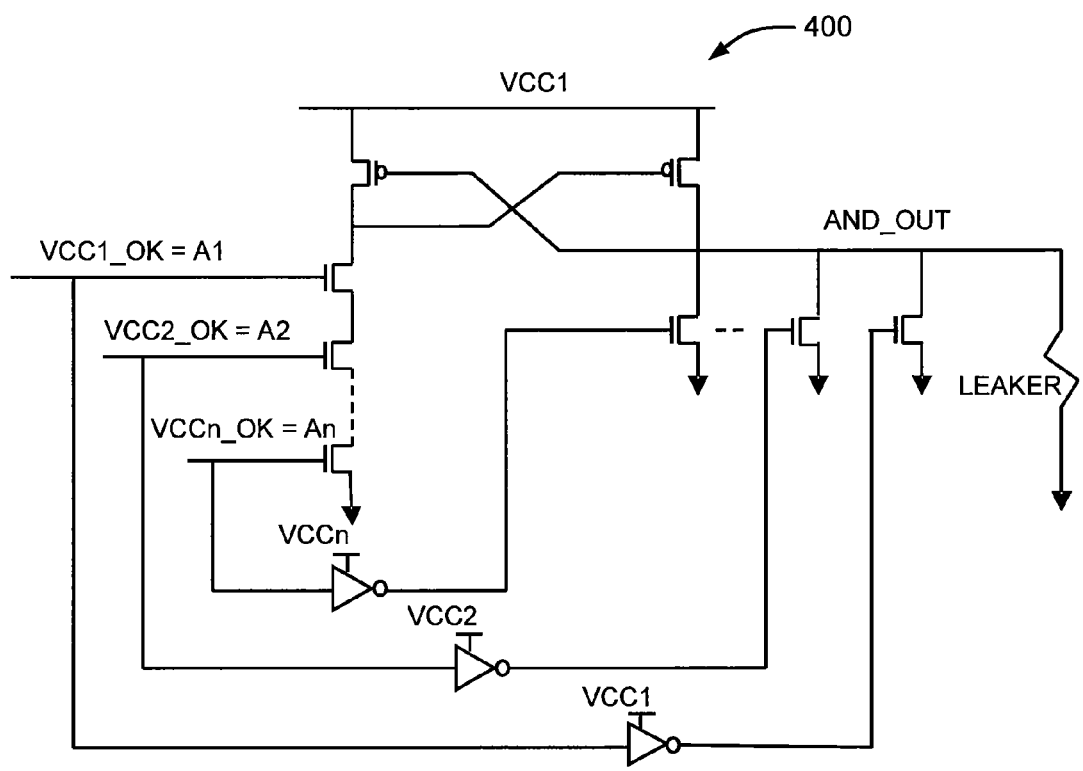
FIG. 4 shows a schematic diagram of an AND_elevator according to various embodiments.
Figure 5:
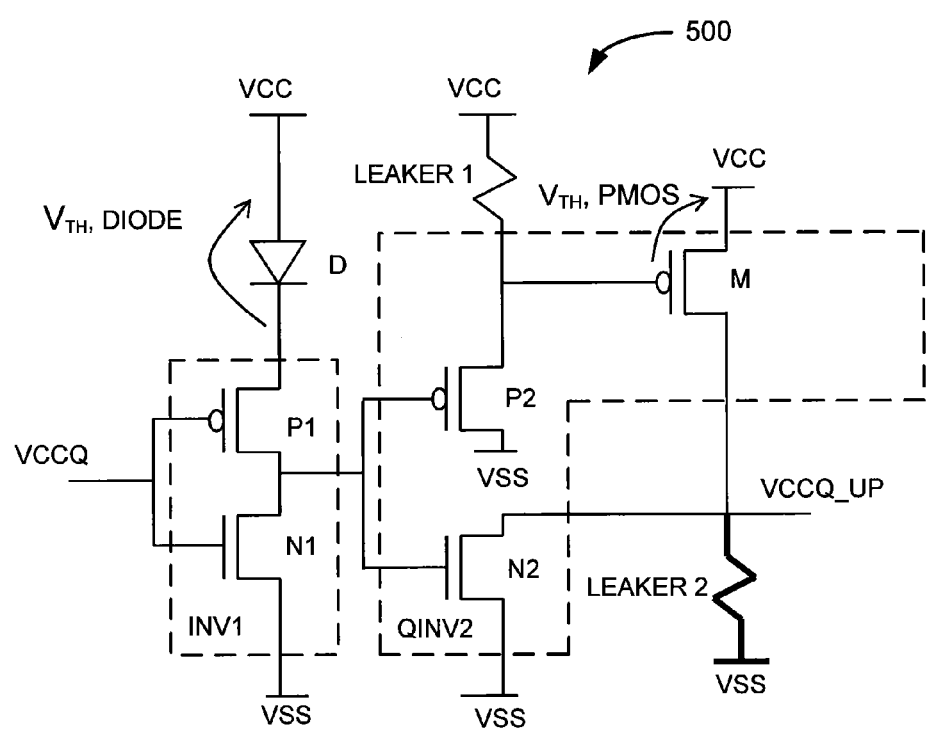
FIG. 5 shows a schematic diagram of a core swing I/O supply voltage detector according to various embodiments.
Figure 6:
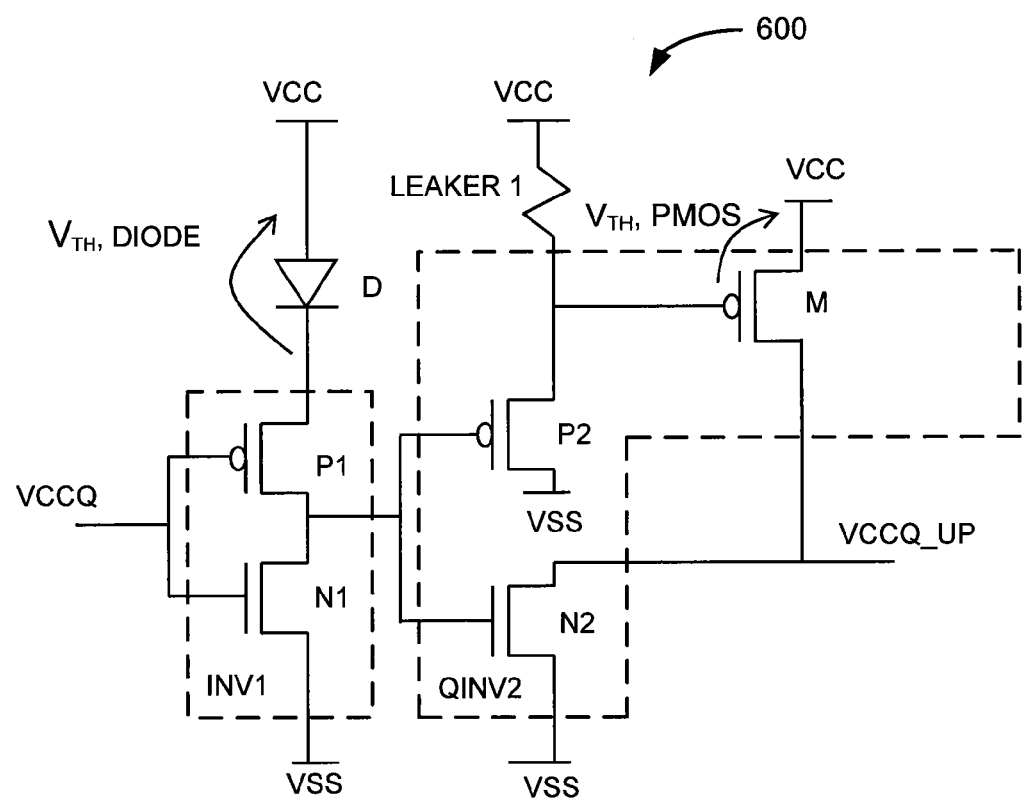
FIG. 6 shows a schematic diagram of a core swing I/O supply voltage detector according to various embodiments.
Figure 7:
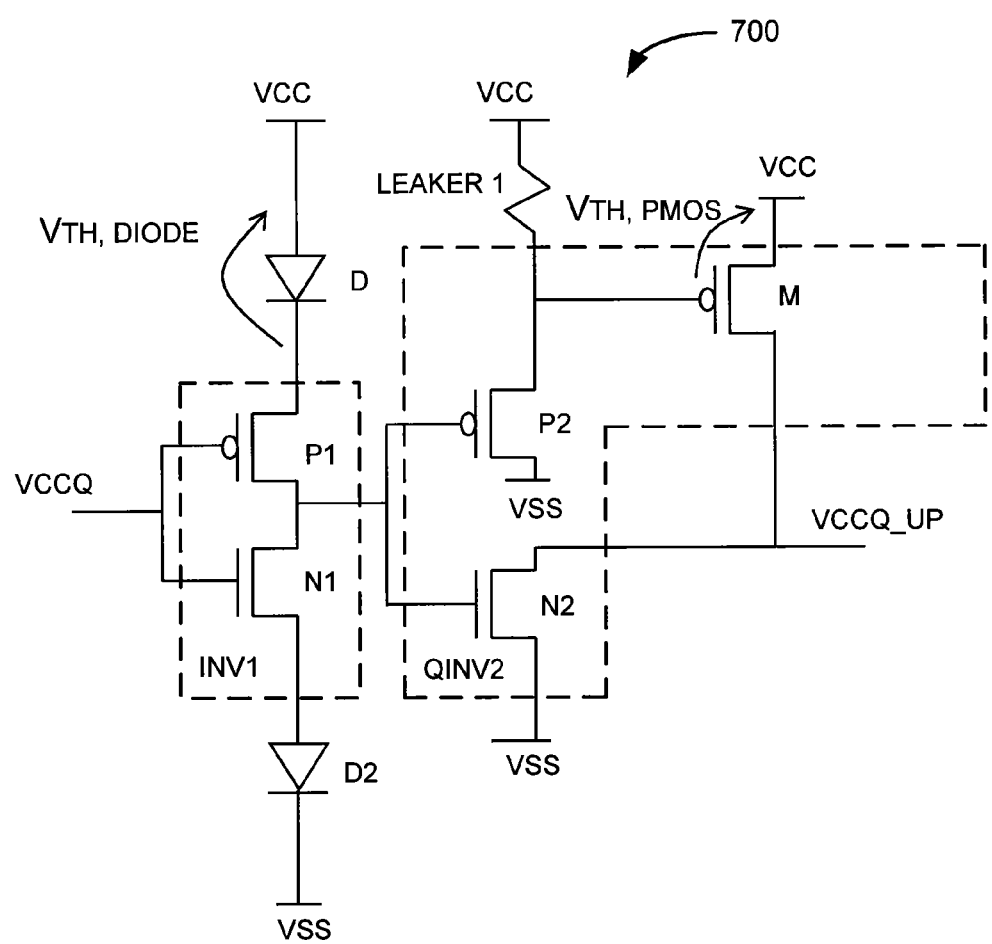
FIG. 7 shows a schematic diagram of a core swing I/O supply voltage detector according to various embodiments.

In various embodiments, the AND_logic 130 may comprise an AND_elevator. A detailed description of the structure and/or function of the AND_logic 130 as the AND_elevator according to various embodiments are provided below with respect to FIGS. 3 and 4. The AND_elevator shown in FIGS. 3 and 4 may be used along with the VCC_detector 110 and/or the VCCQ_detector 120 when both detectors are implemented as a standard voltage detector, for example, as shown in FIG. 2. In various embodiments, the AND_logic 130 may comprise a standard AND gate when at least one of the two detectors, such as the VCCQ_detector 120, is implemented as a core swing I/O supply voltage detector, for example, as shown in FIGS. 5-7.

It is note that, in various embodiments, the power-on initialization device 100 may be implemented using other combinations of the above-described detectors and/or AND_logic. It is also noted that other modifications may be made to the power-on initialization device 100, such as without using the AND_logic 130 and/or using additional circuit elements, and yet the same functionality as the power-on initialization device 100 may be maintained. Such modifications according to various embodiments are explained below in more detail with respect to FIG. 6.

FIG. 2 shows a schematic diagram of a voltage detector 200 according to various embodiments. As noted above, the voltage detector 200 may be used, for example, as the VCC_detector 110 or the VCCQ_detector 120 of the power-on initialization device 100 of FIG. 1, for example, when the AND_logic 130 is implemented using the AND_elevators 300 and 400 of FIGS. 3 and 4.

In various embodiment, as shown in FIG. 2, the voltage detector 200 may comprise a PMOS (p-type metal-oxide-semiconductor) transistor ("P"), a resistor ("R") serially coupled to a source or a drain of the PMOS transistor, and a logic gate ("L"), such as an inverter, coupled to the source or the drain of the PMOS transistor and the resistor. The source or the drain of the PMOS transistor that is not coupled to the resistor may be coupled to a supply voltage, such as the voltage VCC. One end of the logic gate may also be coupled to the same supply voltage, such as the voltage VCC. One end of the resistor that is not coupled to the PMOS transistor may be coupled to another voltage, such as VSS. A gate of the PMOS transistor and/or another end of the logic gate may also be coupled to the other voltage, such as VSS.

In various embodiments, a threshold voltage for switching the voltage detector 200 may be an added sum of a threshold voltage of the PMOS transistor plus a delta voltage. The delta voltage may be determined depending on at least one of parameters of the PMOS transistor, resistance of the resistor R, or input capacitance of the logic gate L. In various embodiments, the hysteresis of the voltage detector 200 may be obtained using a feedback path of the PMOS transistor. An output voltage of the voltage detector 200 may be within the range of the swing of the supply voltage detected. The swing of a voltage may be the range of the supply voltage, and define possible voltages that a signal (e.g., a given supply voltage) can assume. For example, in one embodiment, the swing (or range) of the output voltage of the voltage detector 200 may be the swing (or range) of the supply voltage, such as about [0, VCC] or about [0, VCCQ].

It is noted that although explanations are given for a scenario where the voltage detector 200 is employed as the VCC_detector 110, the voltage detector 200 may be used as the VCCQ_detector 120 alternatively, or in addition to the voltage detector 200 being used as the VCC_detector 110 with minor adaptations, such as coupling the PMOS transistor and/or the logic gate L to a different supply voltage, such as the voltage VCCQ. In various embodiments, as noted earlier, if both the VCC_detector 110 and the VCCQ_detector 120 are implemented using the voltage detector 200, then the AND_logic 130 may be implemented as a functional logic gate, such as the AND_elevator, for example, as shown in FIGS. 3 and 4.

Figure 3:
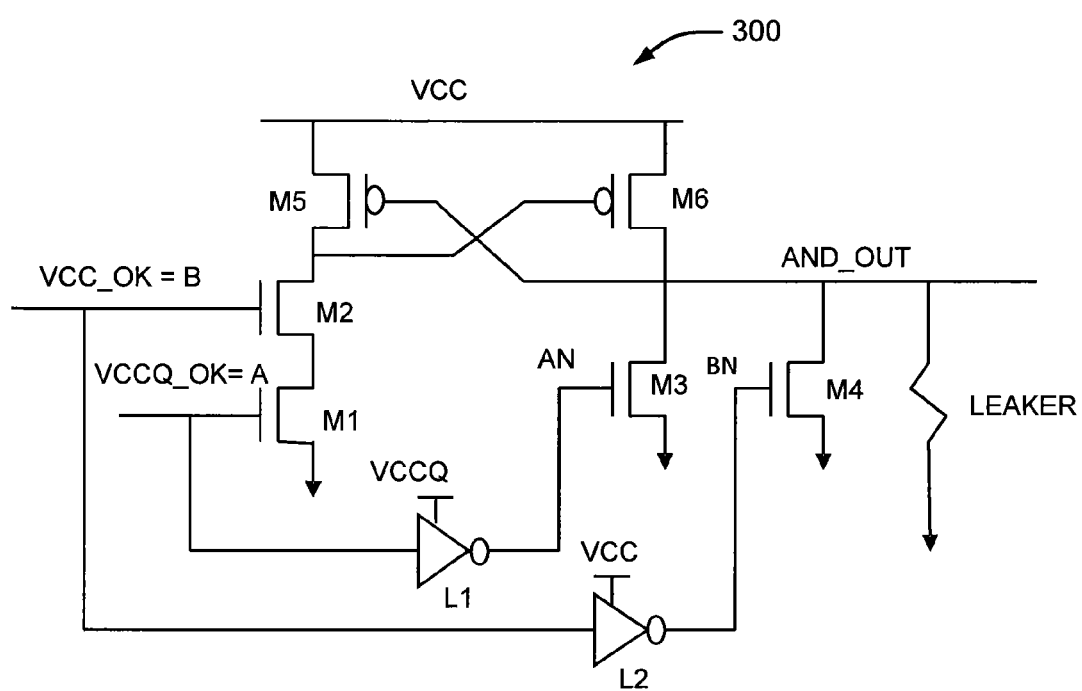
FIG. 3 shows a schematic diagram of an AND_elevator according to various embodiments.

FIG. 3 shows a schematic diagram of the AND_elevator 300 for the power-on initialization device of FIG. 1, according to various embodiments. As shown in FIG. 3, in various embodiments, the AND_elevator 130 may comprise a first set of transistors including a first transistor ("M1") and a second transistor ("M2"). A gate of the first transistor may be coupled to a first signal ("A"), such as signal VCCQ_OK, and a gate of the second transistor may be coupled to a second signal ("B"), such as signal VCC_OK. The first signal, such as VCCQ_OK, may indicate whether a first supply voltage for a first circuit, such the I/O circuit 170, has reached a first threshold voltage (e.g., VCCQ_MIN) to power on the first circuit. Likewise, the second signal, such as the VCC_OK, may indicate whether a second supply voltage for a second circuit, such as the core circuit 160 has reached a second threshold voltage (e.g., VCC_MIN) to power on the second circuit. For example, in one embodiment, if the signal VCC_OK is at a high level, then it may mean that the voltage VCC is larger than the VCC_MIN. Similarly, if the signal VCCQ_OK is at a high level, then it may mean that the voltage VCCQ is larger than the voltage VCCQ_MIN.

In various embodiments, the AND_elevator 300 may comprise a second set of transistors including a third transistor ("M3") and a fourth transistor ("M4"). A gate of the third transistor may be coupled to a first inverted version ("AN") of the first signal, and a gate of the fourth transistor may be coupled to a second inverted version ("BN") of the second signal. An outcome signal ("AND_OUT") of the second set of transistors may be generated responsive to power states of the first and second signals and indicate a power-on state of the memory device including the first and second circuits.

In various embodiments, the AND_elevator 300 may be configured to start the power-on phase of the device only after the first and second supply voltages have reached a corresponding one of the first and second threshold voltages.

In various embodiments, the first and second transistors (M1 and M2) may be serially connected, and the third and fourth transistors (M3 and M4) may be connected in parallel. In various embodiments, each of at least two of the first, second, third, and fourth transistors may comprise an NMOS (n-type metal-oxide-semiconductor) transistor.

In various embodiments, the AND_elevator 300 may comprise a first logic gate ("L1") and a second logic gate ("L2"). The first logic gate may be coupled to the gate of the third transistor and configured to generate the first inverted version. Similarly, the second logic gate may be coupled to the gate of the fourth transistor and configured to generate the second inverted version.

In various embodiments, the AND_elevator 300 may comprise a pull-up path including a fifth transistor ("M5") and a sixth transistor ("M6"). A gate of the fifth transistor may be coupled to at least one of the second set of transistors (M3 and M4), and a gate of the sixth transistor coupled to at least one of the first set of transistors (M1 and M2). The pull-up path may be configured to boost at least one of the first signal or the second signal based on a level of the second supply voltage, such as the voltage VCC. Such elevator configuration of the pull-up path allows managing the input signals (A and B) defined in different voltage ranges, such as the signal VCCQ_OK and the signal VCC_OK, with undesired power (or voltage) consumptions eliminated or reduced.

In various embodiments, a source or a drain of each of the fifth and sixth transistors (M5 and M6) may be coupled to the second supply voltage, such as the voltage VCC. In various embodiments, the source or the drain of the fifth transistor (M5) that is not coupled to the second supply voltage, may be serially coupled to one of the first set of transistors (M1 and M2), such as the second transistor (M2). In various embodiments, a source or a drain of the sixth transistor (M6) may be serially coupled to one of the second set of transistors (M3 and M4), such as the third transistor (M3). In various embodiments, each of the fifth and sixth transistors may comprise a PMOS transistor.

In various embodiments, the AND_elevator 300 may comprise a pull-down leaker ("Leaker") coupled to the third and fourth transistors in parallel. In one embodiment, the pull-down leaker may comprise at least one resistor, and may be configured to resolve a floating state of the outcome signal (AND_OUT) of the second set of transistors (M3 and M4), for example, when both the signal VCC_OK and the signal VCCQ_OK are not high. The pull-down leaker may be configured to control the voltage of the output signal. As noted above, the signal VCCQ_OK and/or the signal VCC_OK being at a high level may mean that the voltage VCC detected is larger than the voltage VCC_MIN and/or the voltage VCCQ detected is larger than the voltage VCCQ_MIN, respectively.

In various embodiments, for example, the first signal (e.g., VCCQ_OK) may be received from a first voltage detector (e.g., VCCQ_detector 120) associated with the first circuit (e.g., I/O circuit 170). Similarly, the second signal (e.g., VCC_OK) may be received from a second voltage detector (e.g., VCC_detector 110) associated with the second circuit (e.g., core circuit 160).

In various embodiments, for example, the first circuit may comprise a first one of the core circuit 160 (e.g., microcontroller) and the I/O circuit 170, and the second circuit may comprise a second one of the core circuit 160 and the I/O circuit 170. In various embodiments, the first circuit may be configured to operate in a first voltage range of about [0, VCCQ], and the second circuit may be configured to operate in a second voltage range of about [0, VCC], different from the first voltage range. For example, in one embodiment, an upper limit of the second voltage range (e.g., about [0, 1.8V]) may be higher than that of the first voltage range (e.g., about [0, 1.2V]) and vice versa.

In various embodiments, the AND_elevator 300 may be configured to provide an indication associated with one of the first and second voltages prior to providing an indication associated with the other of the first and second supply voltages. For example, in one embodiment, the indication associated with the voltage VCC (e.g., the second signal) may be provided prior to the indication associated with the voltage VCCQ (e.g., the first signal) being provided and vice versa. When using the sequenced supply indications associated with the first and second supply voltages, the AND_elevator 300 may be implemented without using the leaker in some embodiments since, for example, no floating state in the outcome signal is expected.

In various embodiments, the AND_elevator 300 may be configured to handle more than two input signals. For example, in various embodiments, the first set of transistors may further comprise one or more additional transistors to couple to a corresponding one of one or more additional input signals. Similarly, the second set of transistors may further comprise one or more additional transistors to couple to an additional inverted version of the corresponding one of the one or more additional input signals. More detailed description of the structure and/or function of a generalization of the AND_elevator 300 are provided below with respect to FIG. 4.

FIG. 4 shows a schematic diagram of another embodiment of an AND_elevator 400 according to various embodiments. For example, in various embodiments, another embodiment of the AND_elevator may comprise a multi AND_elevator 400 configured to handle more than two input signals ("A1", "A2" ... "An"), such as "VCC1_OK," "VCC2_OK" ... "VCCn_OK" each corresponding to supply voltages, "VCC1", "VCC2" ... "VCCn", respectively, of a corresponding one of a plurality of circuits of a given memory device (e.g., the memory device 150). In various embodiments, the voltage range of the greatest voltage out of the more than two supply voltages may be selected as the voltage range of an outcome signal, such as the signal AND_OUT, of the multi AND_elevator 400.

It is noted that although the multi AND_elevator 400 employs more circuit elements, such as transistors or inverters, than the AND_elevator 300 of FIG. 3, to deal with more than two supply voltages, the multi AND_elevator 400 may otherwise maintain the same structure and/or functions as the AND_elevator 300, such as using a pull-up path or a pull-down leaker. It is also noted that although the multi AND_elevator 400 is described using only input signals corresponding to core circuit supply voltages (e.g., VCC1~VCCn) for clarity, all or some of the input signals may be replaced with other signals corresponding to different supply voltages, such as I/O circuit supply voltages. Yet, the same functionality may be maintained.

FIG. 5 shows a schematic diagram of a core swing I/O supply voltage detector 500 according to various embodiments. As noted above, instead of using standard voltage detectors, for example, as shown in FIG. 2 for both the VCC_detector 110 and the VCCQ_detector 120, and using the AND_elevator 300 (or the multi AND_elevator 400) for the AND_logic 130, the power-on initialization device 100 may be implemented using the core swing I/O supply voltage detector 500 for the VCCQ_detector 120 with a standard AND gate for the AND_logic 130.

For example, in the case of two supply voltages VCCQ<VCC, the combinational use of the core swing I/O supply voltage detector 500 along with a standard AND gate allows realizing the elevation of a lower supply voltage (e.g., VCCQ) to the level of a higher supply voltage (e.g., VCC) in an associated voltage detector (e.g., VCCQ_detector). This allows the voltage detector associated with the lower supply voltage (e.g., VCCQ_detector) to have the output in the swing (or range) of the higher supply voltage (e.g., about [0, VCC]) instead of the swing (or range) of its own lower supply voltage (e.g., about [0, VCCQ]). This in turn allows realizing operation of the standard AND gate in the swing (or range) of the higher supply voltage (e.g., VCC). As a result, this may obviate the need to elevate the voltage range of the lower supply voltage (e.g., VCCQ) in the standard AND gate, and the need, for example, to use the AND_elevator 300 for the AND_logic 130.

In various embodiments, referring to FIG. 5, the core swing I/O supply voltage detector 500 may comprise a first set of transistors including a first transistor ("P1") and a second transistor ("N1"). Gates of the first and second transistors may be coupled to a first supply voltage (e.g., VCCQ). In one embodiment, the first supply voltage may be a voltage configured to power on a first circuit (e.g., the I/O circuit 170) having a first voltage range, such as about [0, VCCQ].

A source or a drain of the first transistor may be coupled to at least one diode ("D"). The at least one diode may be couple to a second supply voltage (e.g., VCC). In one embodiment, the at least one diode (D) may be configured to convert a first value in the range of the first supply voltage (e.g., VCCQ) into a second value in the range of the second supply voltage (e.g., VCC), and vice versa, for example, by a margin of a threshold voltage ($V_{TH}$, Diode) of the at least one diode (D). In one embodiment, the second supply voltage may be a voltage configured to power on a second circuit (e.g., the core circuit 160) of the memory device and having a second voltage range, such as about [0, VCC], different from the first voltage range.

The core swing I/O supply voltage detector 500 may comprise a second set of transistors including a third transistor ("P2") and a fourth transistor ("N2"). Gates of the third and fourth transistors may be coupled to one or more of the first set of transistors (P1 and N1). A source or a drain of the third transistor may be coupled to at least one leaker ("Leaker 1") to couple to the second voltage. A source of a drain of the fourth transistor may be coupled to an outcome signal, such as VCCQ_OK (e.g., VCCQ_UP or VCCQ_DOWN). The outcome signal may be generated responsive to a voltage within the second voltage range and indicate whether the first supply voltage has reached a threshold voltage (e.g., VCCQ_MIN) to power on the first circuit.

In various embodiments, the first transistor may comprise a first one of a PMOS transistor and an NMOS transistor, and the second transistor may comprise a second one of the PMOS transistor and the NMOS transistor. Similarly, in various embodiments, the third transistor may comprise a first one of the PMOS transistor and the NMOS transistor, and the fourth transistor may comprise a second one of the PMOS transistor and the NMOS transistor. In various embodiments, at least one of the second transistor (N1), the third transistor (P2) or the fourth transistor (N2) may be coupled to a negative supply voltage, such as VSS.

In various embodiments, the core swing I/O supply voltage detector 500 may comprise one or more transistors including a fifth transistor ("M"). A gate of the fifth transistor may be coupled to the source or the drain of the third transistor and the at least one leaker. A first one of a source and a drain of the fifth transistor (M) may be coupled to the second supply voltage (e.g., VCC), and a second one of the source and the drain of the fifth transistor (M) may be coupled to the outcome signal (e.g., VCCQ_OK). In various embodiments, the fifth transistor may comprise a same type of transistor, such as the PMOS transistor, as the first and third transistors.

In various embodiments, the core swing I/O supply voltage detector 500 may comprise a pull-down leaker ("Leaker 2") coupled to a source or a drain of the fifth transistor and the outcome signal. The pull-down leaker may be configured to resolve a floating state of the outcome signal, such as when the voltage VCC is at a low state (e.g., switched off) and the voltage VCCQ is at a high state (e.g., switched on).

In various embodiments, the source or the drain of the fifth transistor that is not coupled to the pull-down leaker may be coupled to the second supply voltage (e.g., VCC). In various embodiments, one end of the pull-down leaker may be coupled to the negative supply voltage, such as the VSS.

In various embodiments, the core swing I/O supply voltage detector 500 may be configured such that an indication associated with the second supply voltage is provided prior to an indication associated with the first supply voltage being provided. For example, if the first and second supply voltages are switched on in a fixed sequence (e.g., voltage VCCQ being switched on only after voltage VCC is switched on, and vice versa), no floating states are expected in the outcome signal. In such a scenario, the core swing I/O supply voltage detector 500 may be implemented without using the pull-down leaker (Leaker 2), while maintaining the same functionality. Such embodiments of the core swing I/O supply voltage detector 600 with the fixed sequence of supply of the indications associated with the first and second supply voltages are shown in FIG. 6.

Referring to FIGS. 5 and 6, in various embodiments, the first set of transistors (P1 and N1) may comprise a functional inverter ("INV1"=(N1, P1)). The diode (D) may allow the inverter (INV1) to receive an input high level voltage with approximately a local supply voltage VCC at the source of the first transistor (P1) so that it is possible to switch off the first transistor (P1) when the voltage VCCQ is approximately zero. In various embodiments, the output of the functional inverter (INV1) may operate to drive a quasi inverter QINV2= (N2, P2, M), where (P2, M) is a quasi-Darlington configuration. In one embodiment, the fifth transistor (M) may allow the signal VCCQ_UP to reach the high level voltage VCC. Alternatively, or in addition, in one embodiment, the fifth transistor (M) may allow the source voltage of the third transistor P2 to reduce, for example, by a margin of a threshold voltage ($V_{TH}$, PMOS) of the fifth transistor (M) with respect to the voltage VCC so that the transistor P2 can be switched off with the high level voltage of the output of inverter INV1.

FIG. 7 shows a schematic diagram of another embodiment of the core swing I/O supply voltage detector 700, according to various embodiments. Referring to FIGS. 5-7, the provision of the threshold voltage VCCQ_MIN of the first circuit (e.g., I/O circuit) of the core swing I/O supply voltage detector 500, 600, 700 may be substantially due to transistor N1. If a higher threshold voltage is needed, the pull-down of the first set of transistors (e.g., the inverter INV1 (N1, P1)) may be modified. In various embodiments, for example, as shown in FIG. 7, the core swing I/O supply voltage detector 700 may comprise an additional diode ("D2"). One end of the additional diode may be coupled to a source of a drain of the second transistor (N1) that is not connected to the first transistor (P1). Another end of the additional diode may be coupled to the negative supply voltage, such as the VSS. In various embodiments, the additional diode may be configured to increase the threshold voltage VCCQ_MIN associated with the supply voltage VCCQ.

The architectures disclosed in FIGS. 5-7 allow building a supply voltage detector 500, 600, 700 using only two geometries of transistors, one for the P-channel and one for the N-channel, for example, to reduce the residual current consumption and to easily set the input voltage threshold at a specified level. For example, in various embodiments, the voltage detection solution disclosed in FIGS. 5-7 may be implemented using only two MOS transistor geometries (e.g., an N-channel with W=about 3 um and L=about 0.18 um, and a P-channel with W=about 4.5 um and L=about 0.18 um). In various embodiments, the residual consumption of the relevant circuit (e.g., I/O circuit) may be less than about 400 nA in all Model-Temperature-Voltage corners. In various embodiments, the additional diode (D2) may be substituted by a tree structure of diodes to increase the threshold voltage (e.g., VCCQ_MIN), for example, from about 400 mV to about 52 0 mV. Other various embodiments may be possible.

Figure 8:
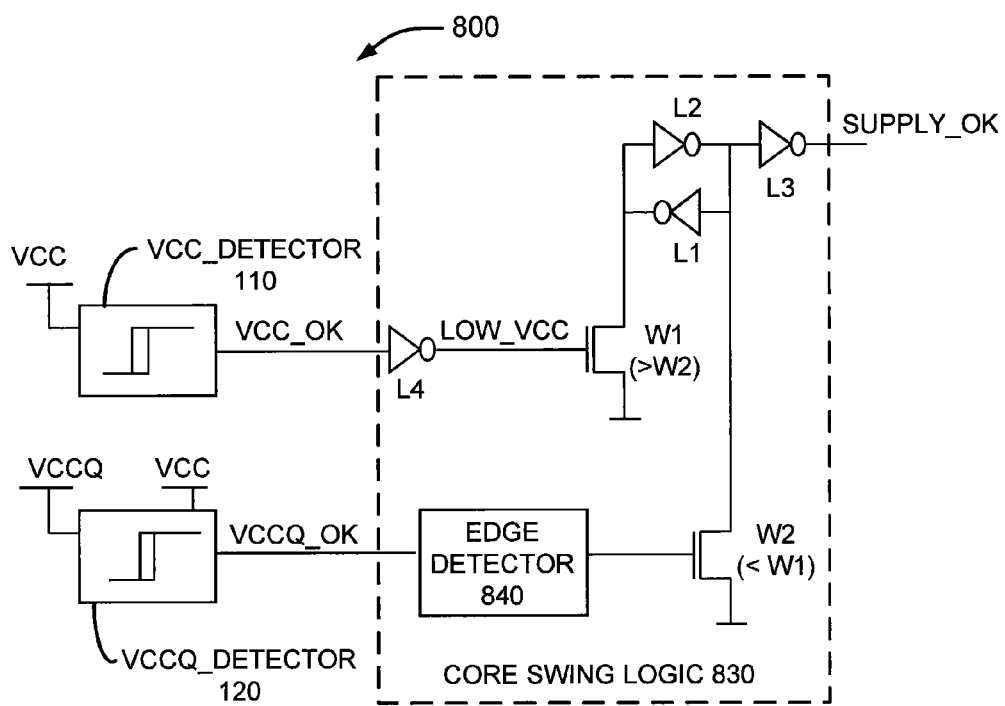
FIG. 8 shows a block diagram of a power-on initialization device to power on a memory device using multiple supply voltages, according to various embodiments.

FIG. 8 shows a block diagram of a power-on initialization device 800 according to various embodiments. As shown in FIG. 8, the device 800 may comprise a first voltage detector, such as the VCC_detector 110, and a second voltage detector, such as the VCCQ_detector 120. In various embodiments, as noted above, the VCC_detector 110 and/or the VCCQ_detector 120 may be implemented as the voltage detector 200 or the core swing I/O supply voltage detector 500, 600, 700. The device 800 may further comprise core swing logic 830 instead of the AND_logic 130, such as the standard AND gate, the AND_elevator 300 of FIG. 3 or the multi AND elevator 400 of FIG. 4. This combination of the core swing logic 830 and the VCC_detector 110 and the VCCQ_detector 120 may provide the same functionality as the power-on initialization device

100, for example, when the VCCQ_detector 120 is implemented as the core swing I/O supply voltage detector 500, 600, 700 of FIGS. 5-7.

In various embodiments, the first voltage detector (e.g., the VCC_detector 110) may be coupled to a first supply voltage (e.g., VCC) having a first voltage range of about [0, VCC], and configured to generate a first outcome signal (e.g., VCC_OK) indicating whether the first supply voltage detected has reached a threshold voltage to power on a first circuit (e.g., the core circuit 160) of a memory device (e.g., the memory device 150). The second voltage detector (e.g., the VCCQ_detector 120) may be coupled to a second supply voltage (e.g., VCCQ) having a second voltage range of about [0, VCCQ] (<[0, VCC]), and configured to generate a second outcome signal (e.g., VCCQ_OK) indicating whether the second supply voltage detected has reached a threshold voltage to power on a second circuit (e.g., the I/O circuit 170) of the memory device.

In various embodiments, for example, as shown in FIGS. 5-7, the second voltage detector (e.g., VCCQ_detector 120) may comprise a first set of transistors including a first transistor (P1) and a second transistor (N1). Gates of the first and second transistors (P1 and N1) may be coupled to the second supply voltage (e.g., VCCQ), and a source or a drain of the first transistor (P1) may be coupled to at least one diode (D) to couple to the first supply voltage (e.g., VCC).

In various embodiments, the second voltage detector (e.g., VCCQ_detector 120) may comprise a second set of transistors including a third transistor (P2) and a fourth transistor (N2). Gates of the third and fourth transistors (P2 and N2) may be coupled to one or more of the first set of transistors (P1 and N1), and a source or a drain of the third transistor (P2) may be coupled to at least one leaker (Leaker 1) to couple to the first supply voltage (e.g., VCC). A source of a drain of the fourth transistor (N2) may be coupled to the second outcome signal (e.g., VCCQ_OK). The second outcome signal (e.g., VCCQ_OK) may be generated responsive to a voltage within the first voltage range (e.g., [0, VCC]).

Referring back to FIG. 8, in various embodiments, core swing logic 830 may be configured to generate a third outcome signal (e.g., SUPPLY_OK) based on the first and second outcome signals (e.g., VCC_OK and VCCQ_OK). The third outcome signal (e.g., SUPPLY_OK) may indicate a power-on state of the memory device (e.g., the memory device 150 of FIG. 1) including the first and second circuits.

In various embodiments, the core swing logic 830 may further comprise at least one logic gate ("L4") coupled to the first voltage detector (e.g., the VCC_detector 110). In one embodiment, the at least one logic gate (L4) may be configured to reduce a level of the first outcome signal (e.g., VCC_OK) to provide a low voltage signal ("LOW_VCC").

In various embodiments, the core swing logic 830 may further comprise a fifth transistor ("W1"). In one embodiment, the gate of the fifth transistor may be coupled to the low voltage signal (LOW_VCC).

In various embodiments, the core swing logic 830 may further comprise an edge detector 840 coupled to the second voltage detector (e.g., VCCQ_detector 120). In one embodiment, the edge detector 840 may be configured to detect a rising edge of the second outcome signal (e.g., VCCQ_OK) for a specified period of time and to produce a signal (e.g., a rectangular signal or pulse signal) to indicate the detected rising edge.

In various embodiments, the core swing logic 830 may further comprise a sixth transistor ("W2"). In one embodiment, the gate of the sixth transistor may be coupled to the edge detector 840. In one embodiment, the strength of the sixth transistor may be less than that of the fifth transistor (W1).

In various embodiments, the core swing logic 830 may further comprise a set of logic gates including a first logic gate ("L1"), a second logic gate ("L2") and a third logic gate ("L3"). The first logic gate (L1) may be coupled to a source or a drain of the fifth transistor (W1), and a source of a drain of the sixth transistor (W2). The second logic gate (L2) may be coupled in parallel with the first logic gate (L1), and coupled to the source or the drain of the fifth transistor (W1), and the source or the drain of the sixth transistor (W2). The third logic gate (L3) may be coupled to the first logic gate (L1), the second logic gate (L2), the sixth transistor (W2) and the third outcome signal (e.g., SUPPLY_OK). Other embodiments may be possible.

Figure 9:
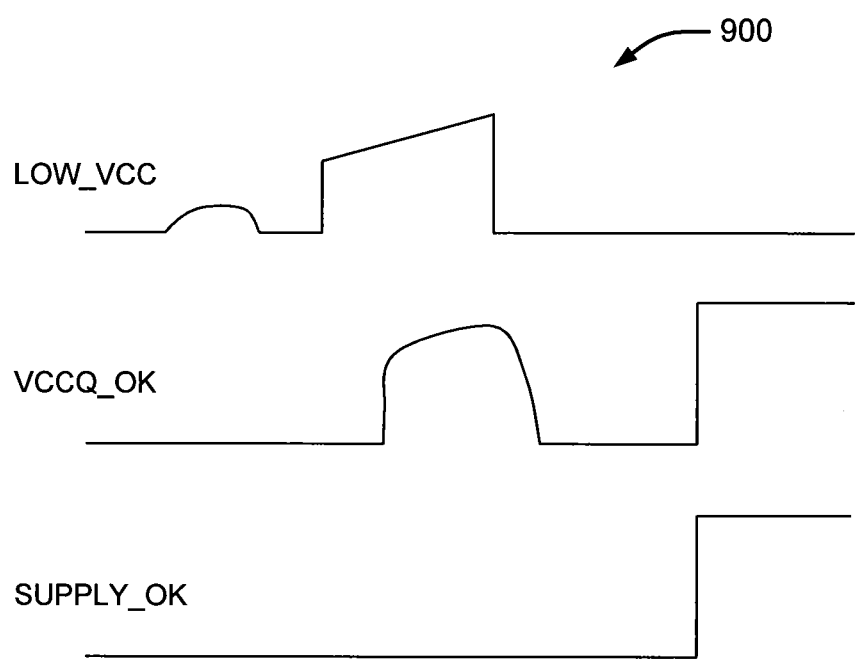
FIG. 9 shows signal diagrams during the power-on phase of a memory device, according to various embodiments.

FIG. 9 shows signal diagrams during the power-on phase of a memory device (e.g., the memory device 150), according to various embodiments. For example, referring to FIGS. 8 and 9, because the VCCQ_detector 120 has its output in the voltage range of about [0, VCC], spurious signals can be present on the signal VCCQ_OK during the VCC ramp (as represented by the signal LOW_VCC in FIG. 9). In various embodiments, a spurious signal may comprise any signal not deliberately created or transmitted, such as a harmonic or other signal outside an assigned range, in a circuit or device which normally creates other signals. As shown in FIG. 9, the high level of the signal SUPPLY_OK may be provided only after the signal VCC_OK (represented by the signal LOW_VCC) reaches a high level and the first rising edge of the signal VCCQ_OK occurs.

It is noted that although Figures and their detailed descriptions disclosed herein are provided herein only with respect to the voltage VCC being greater than the voltage VCCQ (i.e., VCC>VCCQ) for clarity, the apparatus disclosed are also applicable to the situation where the voltage VCCQ is greater than the voltage VCC (i.e., VCCQ>VCC).

The apparatus disclosed herein, such as the power-on initialization device 100, the device 800 and/or one or more elements thereof, such as the AND_elevators 300, 400, the voltage detector 200 and the core swing I/O supply voltage detectors 500, 600, 700, may be useful for starting a power-on phase of a given device, such as the memory device 150 including at least two circuits each configured to operate in a different supply voltage range (e.g., the core and I/O circuits 160 and 170). For example, in various embodiments, the apparatus allow the power-on phase activities of the device to begin only after all the supply voltages (e.g., VCC and VCCQ) associated with the device have reached a corresponding minimum voltage (e.g., a higher than a corresponding one of VCC_MIN or VCCQ_MIN). This in turn may reduce power consumption during the power-on phase of the device.

In addition, the apparatus disclosed herein allow user intervention via the external control PAD interface during the power-on phase of the device. For example, in various embodiments, input control pins may be used to control power consumption with respect to budgeting currents in various parts of the power-on phase. Moreover, in one embodiment, the SUPPLY_OK signal can be set to trigger starting the power-on phase activities via a configuration or a metal option to meet the specific needs of the application for which the device (e.g., the memory device 150) is used.

The apparatus disclosed herein may be useful for sequencing power-on activities of a device having at least two supply voltages. In various embodiments, the device may comprise any type of memory device including Phase Change Memory (PCM) devices (e.g., 1 Gbit PCM in 45 nm technology node); NOR, NAND, SDRAM, and Flash memories; non-volatile memory (NVM); and Low Power Double Data Rate Phase Change Memory devices (LPDDR2). Decreased power consumption, increased control, and enhanced operational accuracy may result.

The illustrations of the apparatus 100, 200, 300, 400, 500, 600, 700, and 800, signals 900, and methods are intended to provide a general understanding of the structures and functionalities of various embodiments, and not as a complete description of all the elements and features of apparatuses or methods that might make use of the structures and functionalities described herein.

The novel apparatus and methods of various embodiments may comprise and/or be included in electronic circuitry used in high-speed computers, communication and signal processing circuitry, single or multi-processor modules, single or multiple embedded processors, multi-core processors, data switches, and application-specific modules including multi-layer, multi-chip modules. Such apparatuses and methods may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, comprising:
   a first set of transistors including a first transistor and a second transistor, a gate of the first transistor to couple to a first signal and a gate of the second transistor to couple to a second signal, the first signal indicating whether a first supply voltage for a first circuit of a memory device reaches a first threshold voltage to power on the first circuit and the second signal indicating whether a second supply voltage for a second circuit of the memory device reaches a second threshold voltage to power on the second circuit;
   a second set of transistors including a third transistor and a fourth transistor, a gate of the third transistor to couple to a first inverted version of the first signal and a gate of the fourth transistor to couple to a second inverted version of the second signal, an outcome signal of the second set of transistors indicating a power-on state of the memory device responsive to power states of the first and second signals; and
   a pull-up path including a fifth transistor and a sixth transistor, a gate of the fifth transistor coupled to at least one of the second set of transistors and a gate of the sixth transistor coupled to at least one of the first set of transistors.

2. The apparatus of claim 1, wherein the apparatus is configured to start a power-on operational sequence of the device only after the first and second supply voltages have reached a corresponding one of the first and second threshold voltages.

3. The apparatus of claim 1, wherein at least two of the first, second, third, and fourth transistors comprises an NMOS (n-type metal-oxide-semiconductor) transistor.

4. The apparatus of claim 1, further comprising:
   a first logic gate coupled to the gate of the third transistor and configured to generate the first inverted version; and
   a second logic gate coupled to the gate of the fourth transistor and configured to generate the second inverted version.

5. The apparatus of claim 1, wherein the pull-up path is configured to boost at least one of the first or second signal based on a level of the second supply voltage.

6. The apparatus of claim 5, wherein a source or a drain of each of the fifth and sixth transistors is to couple to the second supply voltage.

7. The apparatus of claim 5, wherein a source or a drain of the fifth transistor is serially coupled to one of the first set of transistors.

8. The apparatus of claim 5, wherein a source or a drain of the sixth transistor is serially coupled to one of the second set of transistors.

9. The apparatus of claim 5, wherein each of the fifth and sixth transistors comprises a PMOS (p-type metal-oxide-semiconductor) transistor.

10. The apparatus of claim 1, further comprising:
    a pull-down leaker coupled to the third and fourth transistors in parallel, the pull-down leaker configured to resolve a floating state of the outcome signal.

11. The apparatus of claim 1, wherein the first signal is to be provided from a first voltage detector associated with the first circuit and wherein the second signal is to be provided from a second voltage detector associated with the second circuit.

12. The apparatus of claim 1, wherein the first circuit comprises a first one of a core circuit or an input/output circuit and wherein the second circuit comprises a second one of the core circuit or the input/output circuit.

13. The apparatus of claim 1, wherein the first circuit is configured to operate in a first voltage range and wherein the second circuit is configured to operate in a second voltage range different from the first voltage range.

14. The apparatus of claim 13, wherein the apparatus is to provide an indication associated with the second supply voltage prior to providing an indication associated with the first supply voltage.

15. The apparatus of claim 1, wherein the first set of transistors further comprises one or more additional transistors to couple to a corresponding one of one or more additional signals and wherein the second set of transistors further comprises one or more additional transistors to couple to an additional inverted version of the corresponding one of the one or more additional signals.

* * * * *